(12) United States Patent
Chang et al.

(10) Patent No.: US 12,477,784 B2
(45) Date of Patent: *Nov. 18, 2025

(54) DIPOLES IN SEMICONDUCTOR DEVICES

(71) Applicant: Taiwan Semiconductor Manufacturing Company, Ltd., Hsinchu (TW)

(72) Inventors: Hsiang-Pi Chang, New Taipei (TW); Yen-Tien Tung, Hsinchu (TW); Dawei Heh, Hsinchu (TW); Chung-Liang Cheng, Changhua County (TW); I-Ming Chang, Hsinchu (TW); Yao-Sheng Huang, Kaohsiung (TW); Tzer-Min Shen, Hsinchu (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

This patent is subject to a terminal disclaimer.

(21) Appl. No.: 18/431,921

(22) Filed: Feb. 2, 2024

(65) Prior Publication Data
US 2024/0178319 A1 May 30, 2024

Related U.S. Application Data

(63) Continuation of application No. 17/537,339, filed on Nov. 29, 2021, now Pat. No. 11,894,461.

(Continued)

(51) Int. Cl.
*H10D 30/69* (2025.01)
*H10D 30/01* (2025.01)
(Continued)

(52) U.S. Cl.
CPC ....... *H10D 30/701* (2025.01); *H10D 30/0415* (2025.01); *H10D 64/01* (2025.01); *H10D 64/017* (2025.01); *H10D 64/689* (2025.01)

(58) Field of Classification Search
None
See application file for complete search history.

(56) References Cited

U.S. PATENT DOCUMENTS 11,894,461 B2 * 2/2024 Chang ................. H10D 64/685
2005/0127417 A1 * 6/2005 Saenger ............... H10D 64/691
257/295

(Continued)

*Primary Examiner* — Xiaoming Liu
(74) *Attorney, Agent, or Firm* — KILPATRICK TOWNSEND & STOCKTON LLP

(57) ABSTRACT

A semiconductor device includes a substrate, an interfacial layer formed on the semiconductor substrate, and a high-k dielectric layer formed on the interfacial layer. At least one of the high-k dielectric layer and the interfacial layer is doped with: a first dopant species, a second dopant species, and a third dopant species. The first dopant species and the second dopant species form a plurality of first dipole elements having a first polarity. The third dopant species forms a plurality of second dipole elements having a second polarity. A first concentration ratio of the first concentration of the first dopant species to the second concentration of the second dopant species of the p-type transistor is different from a second concentration ratio of the first concentration of the first dopant species to the second concentration of the second dopant species of the n-type transistor.

20 Claims, 9 Drawing Sheets

Related U.S. Application Data

(60) Provisional application No. 63/166,881, filed on Mar. 26, 2021.

(51) Int. Cl.
  *H10D 64/01* (2025.01)
  *H10D 64/68* (2025.01)

(56) References Cited

U.S. PATENT DOCUMENTS

| | | | | |
|---|---|---|---|---|
| 2005/0224897 A1* | 10/2005 | Chen | ............ | H10D 64/691 257/900 |
| 2010/0276753 A1* | 11/2010 | Greene | ............ | H10D 84/014 438/587 |

* cited by examiner

DIPOLES IN SEMICONDUCTOR DEVICES

PRIORITY CLAIM AND CROSS-REFERENCE

The present application is a continuation of U.S. application Ser. No. 17/537,339, filed Nov. 29, 2021, which claims priority to U.S. Provisional Patent Application No. 63/166,881, filed Mar. 26, 2021, the entire disclosure of which is incorporated herein by reference.

BACKGROUND

The subject matter described herein relates to semiconductor devices, and more particularly to semiconductor devices having dipole elements.

Semiconductor manufacturing processes include numerous fabrication steps or processes, each of which contributes to the formation of one or more semiconductor layers. Each layer may be formed, for example, by doping sections of a crystalline semiconductor substrate. In addition, one or more layers may be formed by adding, for example, conductive, resistive, and/or insulative layers on the crystalline semiconductor substrate.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
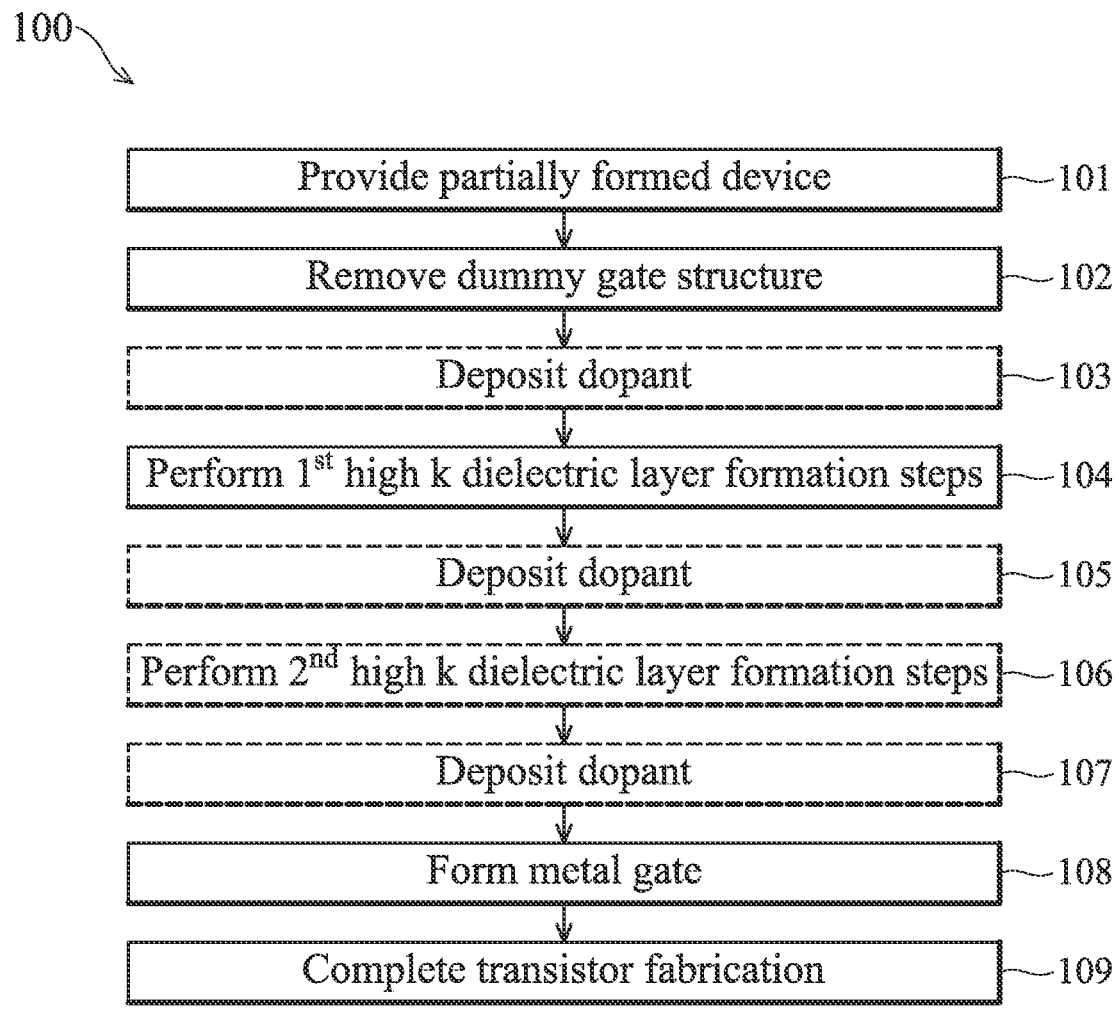
FIG. 1 is a flowchart of a method of fabricating a transistor having an interfacial layer and a high dielectric constant (high-k) gate dielectric, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

As used herein, "high-k" may refer to a dielectric constant k that is higher than the dielectric constant of silicon dioxide. High-k materials typically have a lower equivalent oxide thickness than SiO2 so they could retain an appropriate gate oxide thickness to prevent leakage current while also increasing the switching speed. High-k materials allow reducing leakage while keeping a very low electrical equivalent oxide thickness. Hence, efforts to realize low leakage gate oxide employing high-k dielectric for shrinking sizes of semiconductor devices have been made.

As used herein, the term "equivalent oxide thickness" (EOT) may refer to a measure of the relative thickness of a dielectric layer of a given capacitance per area to the thickness of a silicon dioxide (SiO2) dielectric layer of the same capacitance per area.

As used herein, a threshold voltage (Vt) may refer to a minimum gate-to-source voltage needed to create a conducting path between the source and drain terminals. Native values of threshold voltages needed typically have a dependence on the doping level in the silicon substrate, and can be varied somewhat by choosing an appropriate substrate doping level.

Because of continuously shrinking dimensions of semiconductor devices, traditional threshold voltage tuning based on the work function of metal gates is insufficient.

Threshold voltage tuning based on AlOx dielectric p-dipole doping adversely affects EOT and carrier mobility.

The present disclosure is generally related to semiconductor devices, and more particularly to FinFETs and gate-all-around (GAA) devices. Various embodiments of the present disclosure provide high-k metal gates and methods of making the same during FinFET and GAA processes.

Embodiments discussed herein provide materials and techniques which produce transistors, such as FinFETs and GAA FETs, with tunable threshold voltages using p-dipole dielectric doping (and sometimes n-dipole dielectric doping) which does not increase dielectric thickness, does not adversely affect EOT, does not adversely affect carrier mobility, reduces problematic structural irregularities, and relieves or relaxes design constraints or requirements from the work function and thickness of metal gates.

Referring now to FIG. 1, a flow chart of a method 100 of forming a semiconductor device 200 is illustrated, in accordance with some embodiments. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2 and 3A-6B, which illustrate a portion of the semiconductor device 200 during the intermediate steps of the method 100. FIGS. 3A, 4A, 5A, and 6A are fragmentary cross-sectional views of the device 200 taken along line AA' at intermediate steps of the method 100. FIGS. 3B, 4B, 5B, and 6B are fragmentary cross-sectional views of the device 200 taken along line BB' at intermediate steps of the method 100.

The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the principles taught and discussed in the present disclosure are not limited thereto, and instead, also apply to gate all around (GAA) FET devices, planar FET devices, and other FET devices.

Figure 2:
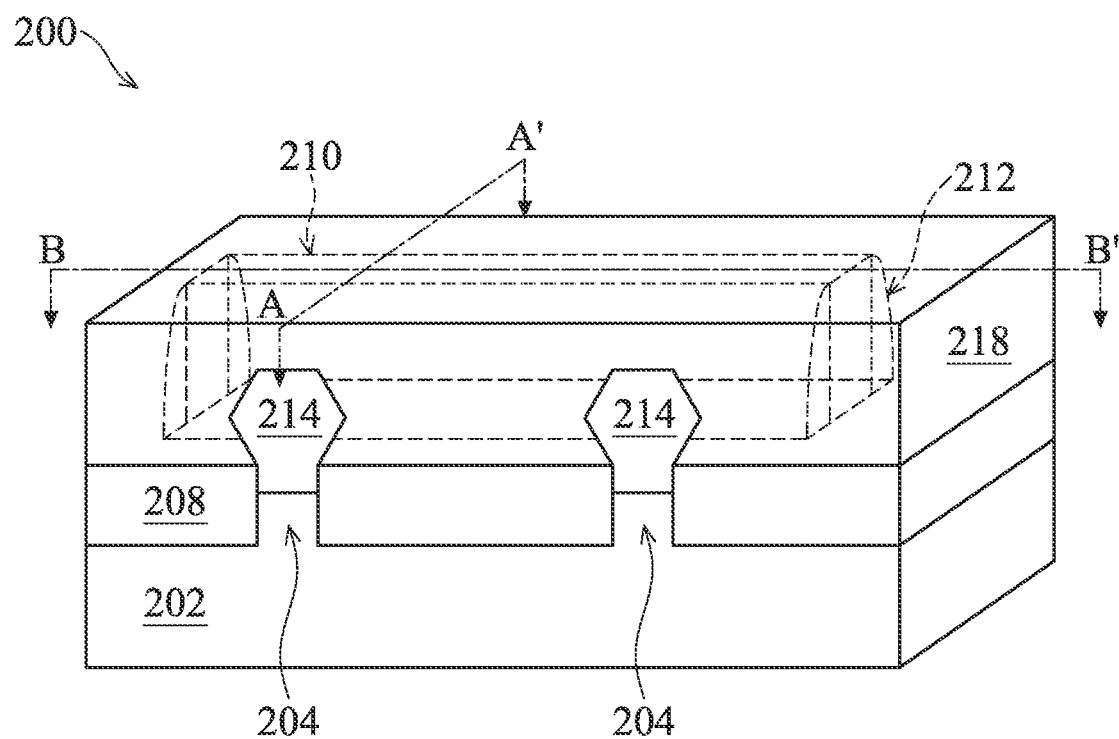
FIGS. 2-6B are schematic perspective or cross-sectional views of a semiconductor device at various stages of fabrication, in accordance with some embodiments.

At operation 101, referring to FIG. 1 and FIG. 2, the method 100 receives a partially formed device 200. Any of numerous processes known to those of skill in the art may be used to make the illustrated partially formed device 200. In the illustrated embodiment, the partially formed device 200 is a partially formed FinFET device.

The device 200 includes a substrate 202 having device regions (hereafter referred to as fins) 204 disposed thereon, a dummy gate structure 210 disposed over the fins 204, and isolation structures 208 disposed over the substrate 202 separating various components of the device 200. For the purpose of simplicity, intermediate steps of the method 100 are hereafter described with reference to cross-sectional views of the device 200 taken along a fin length direction of the fins 204 (i.e., the line AA'), as well as across a channel region of the fins 204 (i.e., the line BB').

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide or, and/or other suitable materials; an alloy semiconductor such as SiGe, GaAsP, AlInAs, AlGaAs, GaInAs, GaInP, GaInAsP; and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or BF2, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the fins 204 may be suitable for forming n-type and/or p-type FinFET. This configuration is for illustrative purposes only and does not limit the present disclosure. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

The device 200 may further include gate spacers 212 disposed on sidewalls of the dummy gate structure 210. In at least one embodiment, the gate spacers 212 include a dielectric material, such as silicon oxide, silicon nitride, silicon carbide, silicon oxynitride, and/or other suitable Thereafter, referring to FIG. 2, the dummy gate structure 210 engages the fins 204 on three sides to form a channel region in each of the fins 204. In at least one embodiment, portions of the dummy gate structure 210 will be replaced with a high-k metal gate structure (HKMG) after other components of the device 200 are fabricated. The dummy gate structure 210 may include one or more material layers, such as an interfacial layer (IL) over the fins 204, a poly-silicon layer over the interfacial layer, a hard mask layer, a capping layer, and/or other suitable layers. Each of the material layers in the dummy gate structure 210 may be formed by any suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), plasma enhanced CVD (PE-CVD), low-pressure CVD (LP-CVD), atomic layer CVD (AL-CVD), atmospheric pressure CVD (AP-CVD), and/or other suitable methods. In one embodiment, the dummy gate structure 210 is first deposited as a blanket layer. The blanket layer is then patterned through a series of lithography and etching processes, thereby removing portions of the blanket layer and keeping the remaining portions over the isolation structures 208 and the fins 204 as the dummy gate structure 210.

dielectric materials. The gate spacers 212 may be a single layered structure or a multi-layered structure. The method 100 may form the gate spacers 212 by first depositing a blanket of spacer material over the device 200, and then performing an anisotropic etching process to remove portions of the spacer material to form the gate spacers 212 on sidewalls of the dummy gate structure 210.

Still referring to FIG. 2, the device 200 further includes source/drain features 214 disposed over the fins 204 and adjacent to the dummy gate structure 210. The source/drain features 214 may be formed by any suitable techniques, such as etching processes followed by one or more epitaxy processes. In one example, one or more etching processes are performed to remove portions of the fins 204 to form source/drain recesses (not shown) therein, respectively. A cleaning process may be performed to clean the source/drain recesses with a hydrofluoric acid (HF) solution or other suitable solution. Subsequently, one or more epitaxial growth processes are performed to grow epitaxial features in the source/drain recesses. Each of the source/drain features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Though not depicted, the device 200 may further include a contact etch-stop layer (CESL; not shown) and an interlayer dielectric (ILD) layer 218 (FIG. 2). The CESL may comprise silicon nitride, silicon oxynitride, silicon nitride with oxygen or carbon elements, and/or other materials, and may be formed by CVD, PVD, ALD, and/or other suitable methods. In some embodiments, the ILD layer 218 includes a dielectric material, such as tetraethylorthosilicate (TEOS), a low-k dielectric material, doped silicon oxide (e.g., boro-phosphosilicate glass (BPSG), fused silica glass (FSG), phosphosilicate glass (PSG), boron doped silicon glass (BSG), etc.), and/or other suitable dielectric materials. The ILD layer 218 may include a multi-layer structure having multiple dielectric materials. The ILD layer 218 may be formed by a deposition process such as, for example, CVD, flowable CVD (FCV), spin-on-glass (SOG) and/or other suitable methods. Subsequent to forming the ILD layer 218, a planarization process such as CMP may be performed such that a top portion of the dummy gate structure 210 is exposed.

Figure 3A:
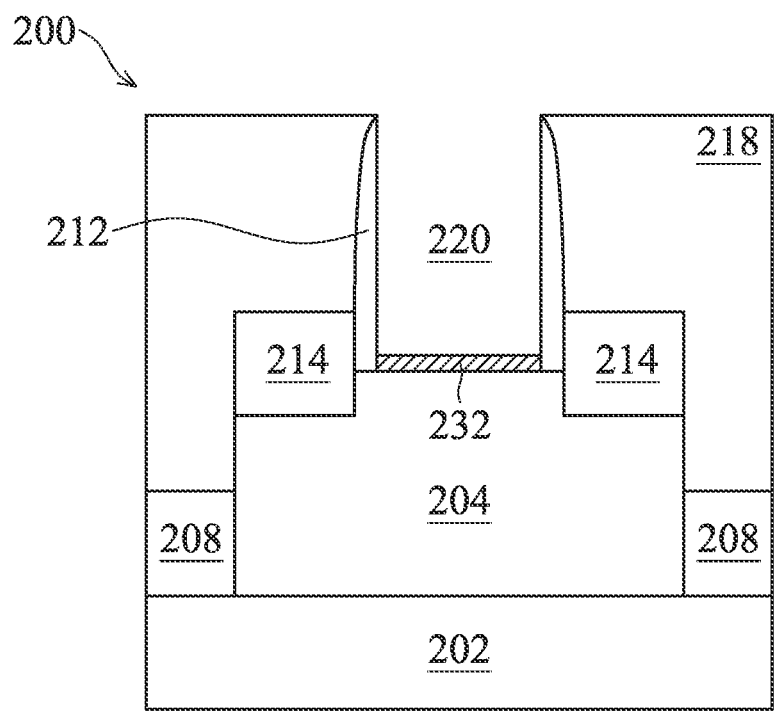
Figure 3B:
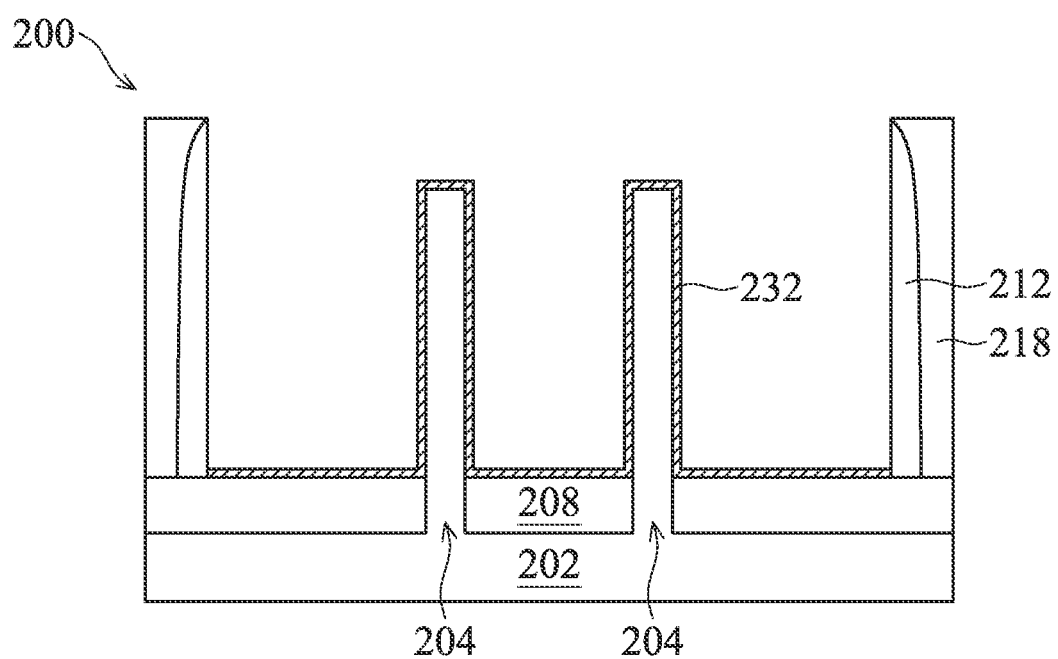

Referring to FIGS. 1 and 3A-3B, the method 100 at operation 102 removes the dummy gate structure 210 to form a trench 220, thereby exposing the interfacial layer (IL) 232 disposed over portions of the fins 204. In some embodiments, forming the trench 220 includes performing an etching process that selectively removes the dummy gate structure 210. The etching process may be a dry etching process, a wet etching process, an RIE, other suitable methods, or combinations thereof. For example, a dry etching process may use chlorine-containing gases, fluorine-containing gases, and/or other etching gases. The wet etching solutions may include ammonium hydroxide (NH4OH), hydrofluoric acid (HF) or diluted HF, deionized water, tetramethylammonium hydroxide (TMAH), and/or other suitable wet etching solutions. The etching process may be tuned such that the etching of the dummy gate structure 210 is subjected to a higher etch rate relative to the CESL and the ILD layer 218. In some embodiments, as depicted in FIGS. 3A-6B, the interfacial layer formed between the poly-silicon layer and the fins 204 remains in the device 200 after removing the dummy gate structure 210 and becomes interfacial layer 232 (discussed in detail below). Alternatively, the interfacial layer is removed with the dummy gate structure 210 and formed subsequently before forming the HKMG. For embodiments in which the device 200 is a GAA device, the interfacial layer may be removed with the dummy gate structure 210 and deposited in a subsequent step before forming a high-k dielectric layer (e.g., high-k dielectric layer 234 discussed below).

In some embodiments, the interfacial layer 232 may include a dielectric material such as a silicon oxide layer (SiO2), a silicon oxynitride (SiON) layer, and the like. The interfacial layer 232 can be, for example, an oxide formed by thermal or chemical oxidation. In some examples, the interfacial layer may result from various processing steps, such as being a native oxide formed as a result of a cleaning process. The interface layer 232 may also be formed by a deposition process, such as an atomic layer deposition (ALD) process, a chemical vapor deposition (CVD) process, a physical vapor deposition (PVD) process, or the like. The interfacial layer 232 maybe formed to an initial thickness in a range from about 2 Å to about 10 Å.

The method 100 in FIG. 1 continues with optional step 103 in which one or more dopant species are deposited on the interfacial layer 232. As discussed in further detail below, the dopant species may include P-type dopant species and/or N-type dopant species, and may have concentrations and concentration ratios selected according to a desired threshold voltage of the transistor being formed using method 100. Accordingly, the threshold voltage of the transistor being formed may depend on or be influenced by the concentrations and concentration ratios of the deposited dopant species. Optional step 103 may include one or more steps of method 400 discussed with reference to FIG. 8 below. In some embodiments, other methods are used.

Figure 4A:
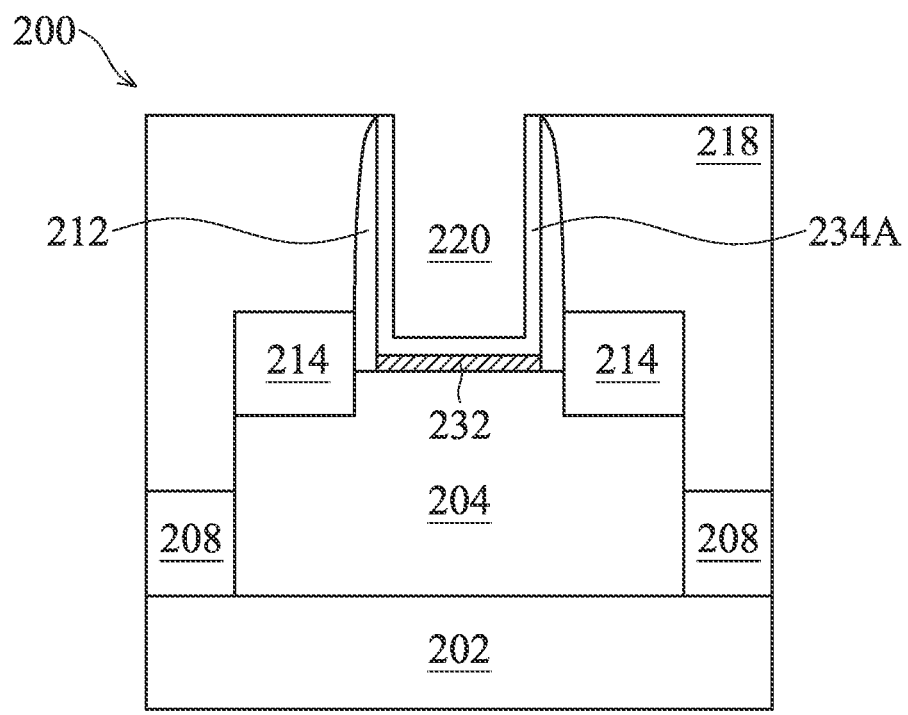
Figure 4B:
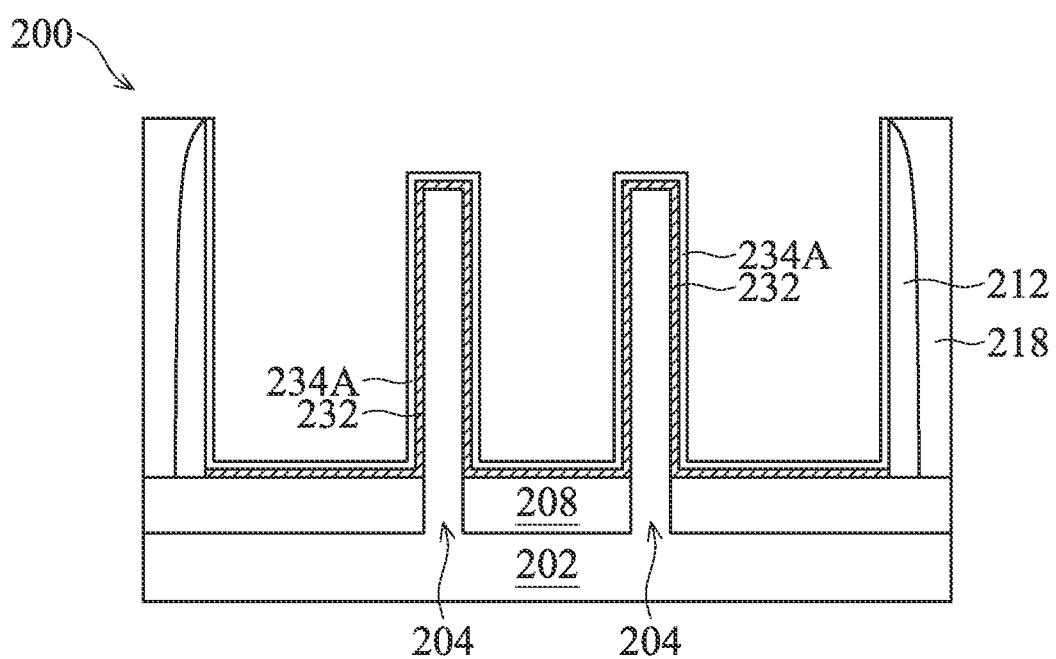
Figure 5A:
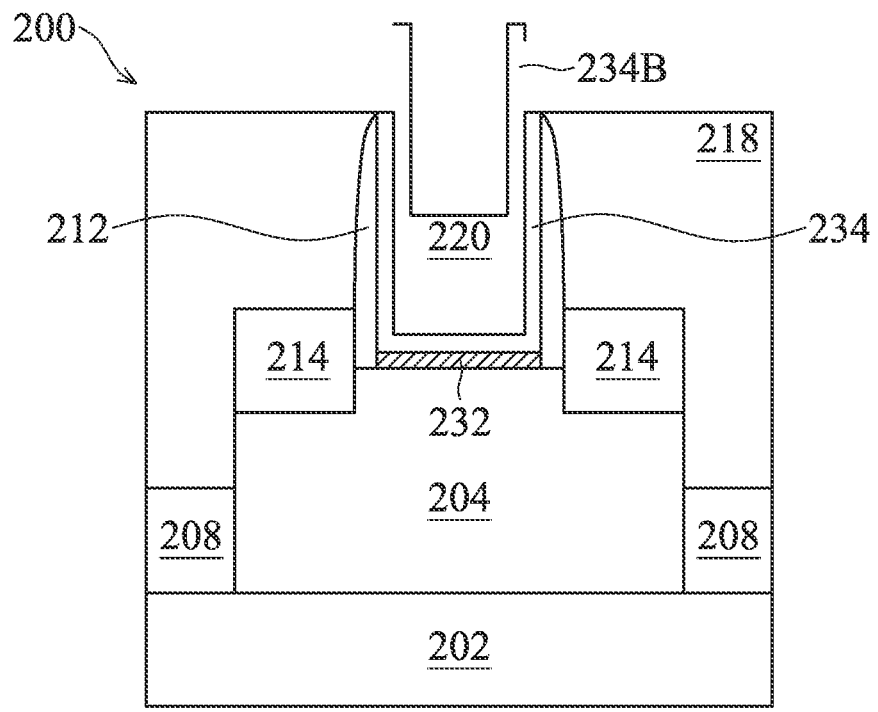
Figure 5B:
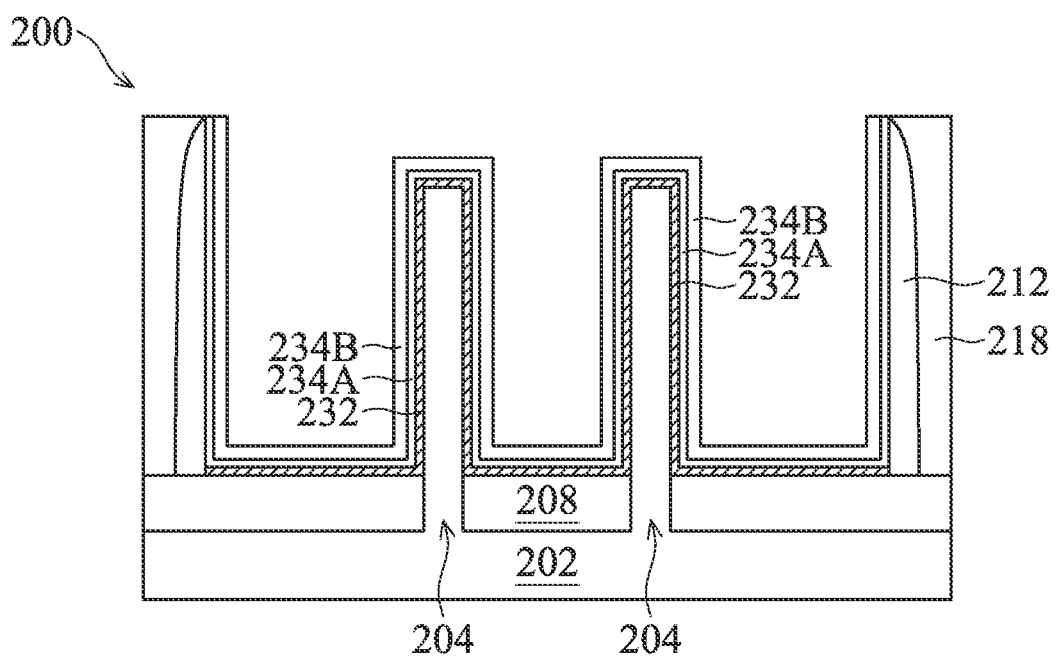

The method 100 proceeds with forming an HKMG in the trench 220, such that the HKMG structure is formed over channel regions of the fins 204. Referring to FIGS. 1 and 4A-4B, the method 100 at operation 104 forms a first high-k dielectric layer 234A over the interfacial layer 232 in the trench 220. A high-k dielectric material may be defined as a dielectric material with a dielectric constant greater than that of SiO2. In many embodiments, the high-k dielectric layer 234A includes hafnium, oxygen, lanthanum, aluminum, titanium, zirconium, tantalum, silicon, other suitable materials, or combinations thereof. In some embodiments, the first high-k dielectric layer 234A comprises a material selected from the group consisting of carbon-doped oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof. In various embodiments, the high-k dielectric layer includes oxides or nitrides of the elements listed above. In an example embodiment, the high-k dielectric layer 234A includes hafnium oxide, such as $HfO_2$.

For embodiments in which the device 200 is a GAA device, the interfacial layer 232 is deposited in the trench 220 before forming the high-k dielectric layer 234A using any suitable method such as ALD. As such, portions of the interfacial layer 232 may be formed on sidewalls of the gate spacers of the GAA structure.

The first high-k dielectric layer 234A may be formed by any suitable method such as, for example, CVD, ALD, PVD, HDP-CVD, MO-CVD, RP-CVD, PE-CVD, LP-CVD, AL-CVD, AP-CVD, and/or other suitable methods.

For example, an ALD process may be used. By providing alternating pulses of a metal (Me) precursor and an oxygen precursor to a reaction chamber, the ALD process is performed to deposit the first high-k dielectric layer 234A over the interfacial layer 232. Each pulse of reactants may saturate the surface in a self-limiting manner.

An exemplary first ALD process of forming the first high-k dielectric layer 234A comprises the following steps. First, the semiconductor substrate 202 is loaded into a reaction chamber. Then, a pulse of a metal (Me) precursor is injected into the reaction chamber loaded with the semiconductor substrate 202 for a first period of time. Here, the metal (Me) precursor of the first ALD process comprises metal-organic compound. In at least one embodiment, the metal-organic compound comprises Li, Be, Mg, Ca, Sr, Sc, Y, Zr, Hf, Al, La, Ce, Pr, Nd, Sm, Eu, Gd, Tb, Dy, Ho, Er, Tm, Yb, or Lu. As for depositing a carbon-doped hafnium oxide, the metal-organic compound comprises tetra-ethyl-methyl amino hafnium (TEMAHf).

As the metal (Me) precursor is injected into the reaction chamber, a chemi-sorption layer of the metal (Me) precursor is formed on the top surface of the interfacial layer 232. Then, any residual metal (Me) precursor is discharged from the reaction chamber for a second period of time. To more effectively discharge the residual metal (Me) precursor from the reaction chamber, purge gas may be injected into the reaction chamber during this purging period, wherein purge gas may include a substantially inert gas such as N2, Ar, He, or similar inert gases.

After discharging the residual metal (Me) precursor from the reaction chamber, a pulse of an oxygen precursor may be injected into the reaction chamber for a third period of time. Here, the oxygen precursor may be selected from the group consisting of H2O, D2O, O3, O2, and mixtures thereof. The O2 and O3 process parameters of concentration and pulse time are fine-tuned to avoid the bottom interfacial layer regrowth. The oxygen precursor reacts with the chemisorption layer of the metal (Me) precursor at a temperature of, for example, about 150° C. to 275° C. As a result, an atomic layer of the first high-k dielectric layer 234A is formed on the interfacial layer 232. During the ALD process, the reactor pressure, may, for example, be 0.1 torr to 10 torr. In the present embodiment, a carbon concentration of the first high-k dielectric layer 234A is from about 0.3 to 3 atomic percent.

Then, any residual oxygen precursor is discharged from the reaction chamber for a fourth period of time. To more effectively discharge the residual oxygen precursor from the reaction chamber during this second purging period, a substantially inert gas such as N2, Ar, He, or the like may be injected into the reaction chamber.

In some embodiments, the ALD process comprises a sequence of ALD cycles, such as the activities of the first through fourth time periods, as described above, during which each of the metal (Me) precursor and the oxygen precursor is alternately injected into and thereafter discharged from the reaction chamber, and, when taken together, are regarded as one deposition or layer formation cycle. In the present embodiment, the first ALD process comprises over 10 cycles for forming carbon-doped hafnium oxide. By repeating this cycle multiple times, the first high-k dielectric layer 234A having a desired thickness is thereby formed. In at least one embodiment, the first high-k dielectric layer 234A has a thickness t1 greater than 3.5 angstroms. In an alternative embodiment, the thickness t1 of the first high-k dielectric layer 234A is from about 3.5 angstroms to 10 angstroms.

In this example, the method 100 in FIG. 1 continues with step 105 in which one or more dopant species is deposited on the first high-k dielectric layer 234A. As discussed in further detail below, the dopant species may include P-type dopant species and/or N-type dopant species, and may have concentrations and concentration ratios selected according to a desired threshold voltage of the transistor being formed using method 100. Accordingly, the threshold voltage of the transistor being formed may depend on or be influenced by the concentrations and concentration ratios of the dopant species deposited in either or both of optional steps 103 and 105. In some embodiments, step 105 may include one or more steps of method 400 discussed with reference to FIG. 8 below. In some embodiments, other methods are used. It is understood that some embodiments in accordance with the present disclosure may not have step 105.

The method 100 proceeds with optional step 106 in which at least one second high-k dielectric layer 234B is formed over first high-k dielectric layer 234A in the trench 220. In many embodiments, the second high-k dielectric layer 234B includes hafnium, oxygen, lanthanum, aluminum, titanium, zirconium, tantalum, silicon, other suitable materials, or combinations thereof. In some embodiments, the second high-k dielectric layer 234B comprises a material selected from the group consisting of carbon-doped oxides of Li, Be, Mg, Ca, Sr, Sc, Y, Zr, Hf, Al, La, Cc, Pr, Nd, Sm, Eu, Gd, Tb, Dy, Ho, Er, Tm, Yb, Lu, and mixtures thereof. In an example embodiment, the second high-k dielectric layer 234B includes hafnium oxide. In some embodiments, the second high-k dielectric layer 234B comprises the same material as the first high-k dielectric layer 234A. In some embodiments, the second high-k dielectric layer 234B comprises a different material as the material of the first high-k dielectric layer 234A.

For embodiments in which the device 200 is a GAA device, the interfacial layer 232 is deposited in the trench 220 before forming the second high-k dielectric layer 234B using any suitable method such as ALD. As such, portions of the first and second high-k dielectric layers 234A and 234B may be formed on sidewalls of the gate spacers of the GAA structure.

The second high-k dielectric layer 234B may be formed by any suitable method such as, for example, CVD, ALD, PVD, HDP-CVD, MO-CVD, RP-CVD, PE-CVD, LP-CVD, AL-CVD, AP-CVD, and/or other suitable methods.

For example, an ALD process may be used. In some embodiments, the second high-k dielectric layer 234B is deposited over the first high-k dielectric layer 234A using an ALD process which is similar or identical to the ALD process used to deposit the first high-k dielectric layer 234A over the interfacial layer 232 described above. In some embodiments, a different deposition process is used to deposit the second high-k dielectric layer 234B over the first high-k dielectric layer 234A.

In this example, the method 100 in FIG. 1 continues with step 107 in which one or more dopant species are deposited on the second high-k dielectric layer 234B. As discussed in further detail below, the dopant species may include P-type dopant species and/or N-type dopant species, and may have concentrations and concentration ratios selected according to a desired threshold voltage of the transistor being formed using method 100. Accordingly, the threshold voltage of the transistor being formed may depend on or be influenced by the concentrations and concentration ratios of the dopant species deposited in one, or more, or all of optional steps 103, 105, and 107. In some embodiments, step 107 may include one or more steps of method 400 discussed with reference to FIG. 8 below. In some embodiments, other methods are used. It is understood that some embodiments in accordance with the present disclosure may not have step 107.

Figure 6A:
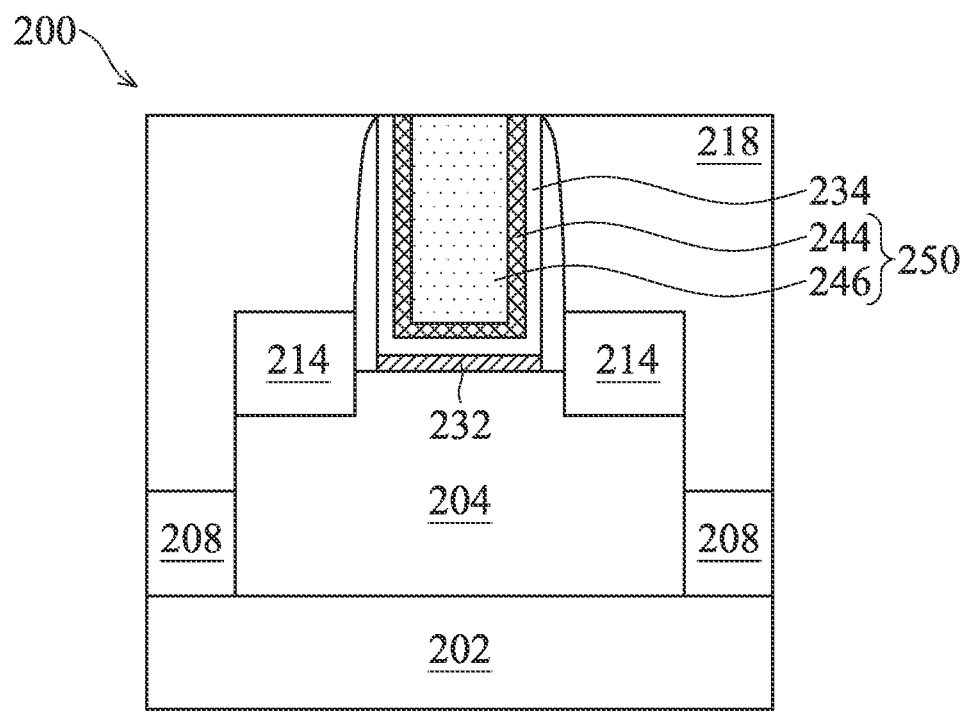
Figure 6B:
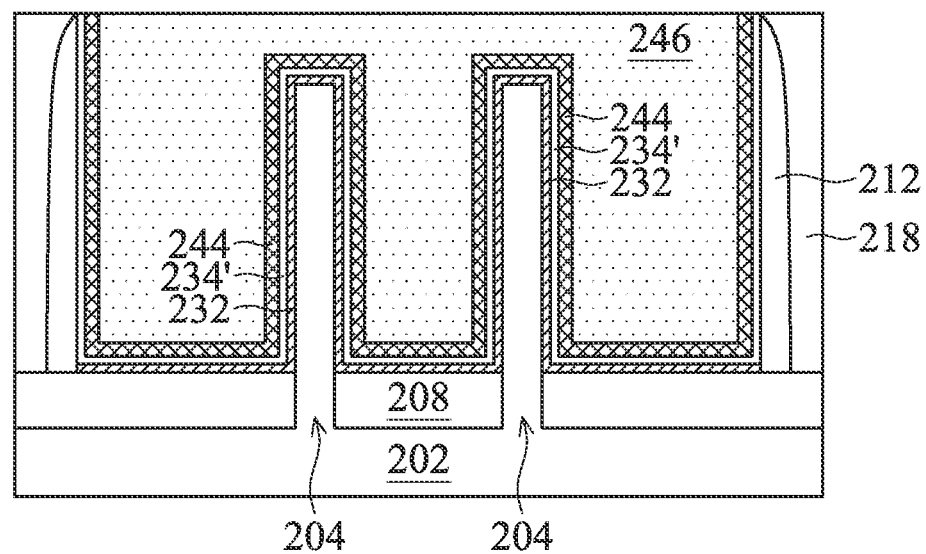

Referring to FIGS. 1 and 6A-6B, the method 100 at operation 108 forms a metal gate structure 250 over the high-k dielectric layer 234. In many embodiments, forming the metal gate structure 250 includes forming a work function metal layer 244 over the layer 240. The work function metal layer 244 may be a p-type or an n-type work function metal layer. Example work function metals include TiN, TaN, Ru, Mo, Al, WN, ZrSi2, MoSi2, TaSi2, NiSi2, WN, Ti, Ag, TaAl, TaAlC, TiAlN, TaC, TaCN, TaSiN, Mn, Zr, other suitable work function materials, or combinations thereof. The work function metal layer 244 may include a plurality of layers and may be deposited by ALD, CVD, PVD, other suitable processes, or combinations thereof.

In addition, referring still to FIGS. 6A-6B, the method 100 at operation 108 forms a bulk conductive layer 246 over the work function metal layer 244 to complete the formation of the metal gate structure 250. In the present embodiments, the interfacial layer 232, the layer high-k dielectric layer 234, and the metal gate structure 250 together form an HKMG. The bulk conductive layer 246 may, for example, include W, Al, copper (Cu), cobalt (Co), ruthenium (Ru), gold (Au), silver (Ag), and/or other suitable conductive materials. Referring to FIG. 6A, the bulk conductive layer 246 fills the remaining space of the trench 220. The bulk conductive layer 246 may be formed by CVD, PVD, plating, other suitable processes, or combinations thereof. A CMP process may be performed to remove excess materials from the HKMG so as to planarize a top surface of the device 200.

In some embodiments, forming the metal gate structure 250 at operation 108 includes forming various additional material layers. For example, a capping layer (not depicted) may be formed over the high-k dielectric layer 234 to protect the underlying high-k dielectric layer 234 from subsequent thermal processes. The capping layer may include a metal nitride, such as TiN, TaN, NbN, or other suitable materials and may be formed to any suitable thickness by a deposition process such as ALD, CVD, PVD, other suitable processes, or combinations thereof. In some examples, a barrier layer (not depicted) may be formed over the high-k dielectric layer 234 (e.g., over the capping layer). In many embodiments, the barrier layer is configured to protect the underlying layer high-k dielectric layer 234 from metal impurities introduced in subsequent fabrication processes, such as forming of the work function metal layer 244. The barrier layer may include a metal nitride, such as TaN, TIN, NbN, other suitable materials, or combinations thereof and may be formed to any suitable thickness by a deposition process such as ALD, CVD, PVD, other suitable processes, or combinations thereof.

Subsequently, at operation 109, the method 100 performs additional processing steps to the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides. Then, subsequent processes, including interconnect processing, are performed after forming the metal gate electrode layer 228 of the gate structure 220 to complete the semiconductor device 200 fabrication, as understood by those of skill in the art.

Figures 7A, 7B, 7C:
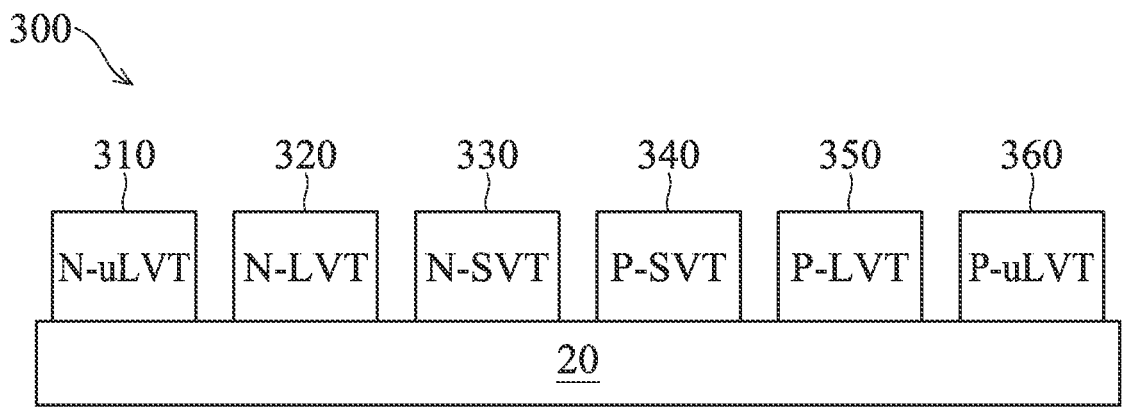
FIG. 7A is a schematic cross-sectional view of a semiconductor device, in accordance with some embodiments.
FIG. 7B is a schematic cross-sectional view of another semiconductor device, in accordance with some embodiments.
FIG. 7C is a schematic cross-sectional view of yet another semiconductor device, in accordance with some embodiments.

FIG. 7A is a schematic cross-sectional view of a semiconductor device 300 according to some embodiments. Semiconductor device 300 may have transistors which are instances of semiconductor device 200, which may be manufactured according to method 100 of FIG. 1. For example, as illustrated, device 300 includes substrate 20; N-type transistors 310, 320, and 330; and P-type transistors 340, 350, and 360. N-type transistors 310, 320, and 330, and P-type transistors 340, 350, and 360 may be formed simultaneously or in parallel on substrate 20 according to the aspects and characteristics of method 100 of FIG. 1. Other embodiments have different numbers of transistors.

Each of N-type transistors 310, 320, and 330 is formed with at least three dopant species having a doping concentration profile which results in desired concentration ratios or concentration ratio profiles of the at least three dopant species, such that the threshold voltages of N-type transistors 310, 320, and 330 are different. For example, N-type transistor 310 may have a very low threshold voltage (uLVT), N-type transistor 320 may have a low threshold voltage (LVT), and N-type transistor 330 may have a standard threshold voltage (SVT).

The different threshold voltages among the N-type transistors 310, 320, and 330 may be achieved, for example, by using first, second, and third dopant species. The first dopant species may be a P-type dopant species, such as Gallium (Ga). Inclusion of the second dopant species may favorably affect one or more structural or lattice properties of one or more of the interfacial layer, the high-k dielectric layer, and an interface between the interfacial layer and the high-k dielectric layer, such as Zinc (Zn). The third dopant species may be an N-type dopant species, such as Lanthanum (La).

To achieve N-type transistors with a very low threshold voltage (uLVT), the concentration ratios or concentration ratio profiles are characterized by a relatively very high ratio of the third dopant species to the first dopant species. To achieve N-type transistors with a low threshold voltage (LVT), the concentration ratios or concentration ratio profiles are characterized by a relatively high ratio of the third dopant species to the first dopant species. To achieve N-type transistors with a standard threshold voltage (SVT), the concentration ratios or concentration ratio profiles are characterized by a relatively standard or nominal ratio of the third dopant species to the first dopant species. In these cases, the concentration of the second dopant species is selected relative to the first dopant species to favorably affect one or more structural or lattice properties of one or more of the interfacial layer, the high-k dielectric layer, and an interface between the interfacial layer and the high-k dielectric layer.

Each of P-type transistors 340, 350, and 360 is formed with at least three dopant species having a doping concentration profile which results in desired concentration ratios or concentration ratio profiles of the at least three dopant species, such that the threshold voltages of P-type transistors 340, 350, and 360 are different. For example, P-type transistor 360 may have a very low threshold voltage (uLVT), P-type transistor 350 may have a low threshold voltage (LVT), and P-type transistor 340 may have a standard threshold voltage (SVT).

The different threshold voltages among the P-type transistors 340, 350, and 360 may be achieved, for example, by using first, second, and third dopant species. The first dopant species may be a P-type dopant species. Inclusion of the second dopant species may favorably affect one or more structural or lattice properties of one or more of the interfacial layer, the high-k dielectric layer, and an interface between the interfacial layer and the high-k dielectric layer. The third dopant species may be an N-type dopant species.

In some embodiments, one or more of the first, second, and third dopant species used in the P-type transistors 340, 350, and 360 is the same dopant species as a corresponding one of the first, second, and third company species used in the N-type transistors 310, 320, and 330. In some embodiments, one or more of the first, second, and third dopant species used in the P-type transistors 340, 350, and 360 is different from the dopant species as a corresponding one of the first, second, and third company species used in the N-type transistors 310, 320, and 330.

To achieve P-type transistors with a very low threshold voltage (uLVT), the concentration ratios or concentration ratio profiles are characterized by a relatively very high ratio of the first dopant species to the third dopant species. To achieve P-type transistors with a low threshold voltage (LVT), the concentration ratios or concentration ratio profiles are characterized by a relatively high ratio of the first dopant species to the third dopant species. To P-type achieve transistors with a standard threshold voltage (SVT), the concentration ratios or concentration ratio profiles are characterized by a relatively standard or nominal ratio of the first dopant species to the third dopant species. In these cases, the concentration of the second dopant species is selected relative to the first dopant species to favorably affect one or more structural or lattice properties of one or more of the interfacial layer, the high-k dielectric layer, and an interface between the interfacial layer and the high-k dielectric layer.

In some embodiments, the concentration ratio or concentration ratio profile of the very low threshold voltage (uLVT) P-type transistors is the same or substantially the same as the concentration ratio or concentration ratio profile of the standard threshold voltage (SVT) N-type transistors. In some embodiments, the concentration ratio or concentration ratio profile of the very low threshold voltage (uLVT) P-type transistors is different from the concentration ratio or concentration ratio profile of the standard threshold voltage (SVT) N-type transistors.

In some embodiments, the concentration ratio or concentration ratio profile of the low threshold voltage (LVT) P-type transistors is the same or substantially the same as the concentration ratio or concentration ratio profile of the low threshold voltage (LVT) N-type transistors. In some embodiments, the concentration ratio or concentration ratio profile of the low threshold voltage (LVT) P-type transistors is different from the concentration ratio or concentration ratio profile of the low threshold voltage (LVT) N-type transistors.

In some embodiments, the concentration ratio or concentration ratio profile of the standard threshold voltage (SVT) P-type transistors is the same or substantially the same as the concentration ratio or concentration ratio profile of the very low threshold voltage (uLVT) N-type transistors. In some embodiments, the concentration ratio or concentration ratio profile of the standard threshold voltage (SVT) P-type transistors is different from the concentration ratio or concentration ratio profile of the very low threshold voltage (uLVT) N-type transistors.

N-type transistors 310, 320, and 330, and P-type transistors 340, 350, and 360 may be formed on substrate 20 according to the aspects and characteristics of method 100 of FIG. 1. Alternative methods may be used to form N-type transistors 310, 320, and 330 and P-type transistors 340, 350, and 360, as understood by those of skill in the art.

Furthermore, the varying concentration ratios or concentration ratio profiles of N-type transistors 310, 320, and 330 and P-type transistors 340, 350, and 360 may be achieved using the method 400 discussed below with reference to FIG. 8. Alternative methods may be used to achieve the varying concentration ratios or concentration ratio profiles of N-type transistors 310, 320, and 330 and P-type transistors 340, 350, and 360, as understood by those of skill in the art.

FIG. 7B is a schematic cross-sectional view of another semiconductor device, in accordance with some embodiments. In this embodiment, the six different threshold voltages in N-type transistors 310, 320, and 330 and P-type transistors 340, 350, and 360 are achieved using three different types of high-k dielectric layer, 381, 382, and 383.

As shown in FIG. 7B, each of the N-type transistors 310, 320, and 330 includes an interfacial layer 370, an N-type metal gate 371, and a metal fill layer 377. Each of the P-type transistors 340, 350, and 360 includes an interfacial layer 370, a P-type metal gate 372, and a metal fill layer 377. N-type transistor 310 and P-type transistor 340 both include a first type of high-k dielectric layer 381, N-type transistor 320 and P-type transistor 350 both include a second type of high-k dielectric layer 382. N-type transistor 330 and P-type transistor 360 both include a third type of high-k dielectric layer 383. The three different types of high-k dielectric layers 381, 382, and 383 are characterized by different concentration ratios or concentrations of the first dopant species, the second dopant species, and the third dopant species as described above.

The different types of high-k dielectric layers are also distinguished by the location of the dopant species. For example, in some embodiments, the first and second dopant species, e.g., for P-type dipoles, are introduced by depositing dopant layers containing the first and second dopant species on the interfacial layer before the formation of the high-k dielectric layer, and the third dopant species are introduced by depositing a dopant layer containing the third dopant species, e.g., for N-type dipoles, on the high-k dielectric layer and driven into the high-k dielectric layer in an annealing process. In alternative embodiments, the three dopant species are introduced by depositing dopant layers containing the dopant species on the high-k dielectric layer and by being driven into the high-k dielectric layer in an annealing process. In some cases, the first and second dopant species, e.g., for P-type dipoles, are introduced into the high-k dielectric layer before the third dopant species, e.g., for N-type dipoles. In other cases, the first and second dopant species, e.g., for P-type dipoles, are introduced into the high-k dielectric layer after the third dopant species, e.g., for N-type dipoles. In addition, appropriate patterning processes are used to introduce the dopant species into the target devices.

FIG. 7C is a schematic cross-sectional view of yet another semiconductor device, in accordance with some embodiments. In this embodiment, the six different threshold voltages in N-type transistors 310, 320, and 330 and P-type transistors 340, 350, and 360 are achieved using six different types of high-k dielectric layer, 381, 382, 383, 384, 384, and 386.

Similar to the devices in FIG. 7B, as shown in FIG. 7C, each of the N-type transistors 310, 320, and 330 includes an interfacial layer 370, an N-type metal gate 371, and a metal fill layer 377. Each of the P-type transistors 340, 350, and 360 includes an interfacial layer 370, a P-type metal gate 372, and a metal fill layer 377. Different from the devices in FIG. 7B, however, each of N-type transistors 310, 320, and 330 and P-type transistors 340, 350, and 360 has a different type of high-k dielectric layer.

N-type transistor 310 includes a first type of high-k dielectric layer 381, N-type transistor 320 includes a second type of high-k dielectric layer 382, and N-type transistor 330 includes a third type of high-k dielectric layer 383. P-type transistor 340 includes a fourth type of high-k dielectric layer 384, P-type transistor 350 includes a fifth type of high-k dielectric layer 382, and P-type transistor 360 includes the sixth type of high-k dielectric layer 386. The six different types of high-k dielectric layers, 381, 382, 383, 384, 385, and 386 are characterized by different concentration ratios or concentrations of the first dopant species, the second dopant species, and the third dopant species as described above.

The different types of high-k dielectric layers are also distinguished by the location of the dopant species. For example, in some embodiments, the first and second dopant species, e.g., for P-type dipoles, are introduced by depositing dopant layers containing the first and second dopant species on the interfacial layer before the formation of the high-k dielectric layer, and the third dopant species are introduced by depositing a dopant layer containing the third dopant species, e.g., for N-type dipoles, on the high-k dielectric layer and by being driven into the high-k dielectric layer in an annealing process. In alternative embodiments, the three dopant species are introduced by depositing dopant layers containing the dopant species on the high-k dielectric layer and by being driven into the high-k dielectric layer in an annealing process. In some cases, the first and second dopant species, e.g., for P-type dipoles, are introduced into the high-k dielectric layer before the third dopant species, e.g., for N-type dipoles. In other cases, the first and second dopant species, e.g., for P-type dipoles, are introduced into the high-k dielectric layer after the third dopant species, e.g., for N-type dipoles. In addition, appropriate patterning processes are used to introduce the dopant species into the target devices.

According to some embodiments, a semiconductor device includes a semiconductor substrate, an interfacial layer formed on the semiconductor substrate, a high-k dielectric layer formed on the interfacial layer, and a conductive gate electrode layer formed on the high-k dielectric layer. At least one of the high-k dielectric layer and the interfacial layer is doped with a first dopant species, a second dopant species, and a third dopant species. The first dopant species and the second dopant species form a plurality of first dipole elements having a first polarity, e.g., P-type dipole moments. The third dopant species forms a plurality of second dipole elements having a second polarity, e.g., N-type dipole moments. The first and second polarities are opposite polarities.

In some embodiments of the semiconductor devices described above, the first dopant species comprises gallium (Ga), and the second dopant species comprises Zinc (Zn). In some embodiments, the semiconductor device described above also includes a first dopant layer containing Ga and a second dopant layer containing Zn disposed between the interfacial layer and the high-k dielectric layer.

According to some embodiments, a semiconductor device includes a semiconductor substrate, and a first transistor having a first threshold voltage. The first transistor includes a first interfacial layer formed on the semiconductor substrate, a first high-k dielectric layer formed on the first interfacial layer, and a first conductive gate electrode layer formed on the first high-k dielectric layer. The semiconductor device includes a second transistor having a second threshold voltage. The second transistor includes a second interfacial layer formed on the semiconductor substrate, a second high-k dielectric layer formed on the second interfacial layer, and a second conductive gate electrode layer formed on the second high-k dielectric layer. At least one of the first high-k dielectric layer and the first interfacial layer, and at least one of the second high-k dielectric layer and the second interfacial layer is doped with a first dopant species, a second dopant species, and a third dopant species. At least one of the first dopant species and the second dopant species forms a first dipole element having a first polarity. The third dopant species forms a second dipole element having a second polarity. The first and second polarities are opposite, and the first and second threshold voltages are different.

In some embodiments of the above semiconductor device, the first transistor has a first concentration of the first dopant species at a first particular location in the at least one of the first high-k dielectric layer and the first interfacial layer and has a second concentration of the second dopant species at the first particular location in the at least one of the first high-k dielectric layer and the first interfacial layer. The second transistor has a third concentration of the first dopant species in a second particular location of at least one of the second high-k dielectric layer and the second interfacial layer and has a fourth concentration of the second dopant species in the second particular location of the at least one of the second high-k dielectric layer and the second interfacial layer. The second particular location of the second transistor corresponds with the first particular location of the first transistor. A first ratio of the first concentration to the second concentration is different from a second ratio of the third concentration to the fourth concentration.

In some embodiments of the above semiconductor device, the first transistor has a first concentration of the first dopant species at a first particular location in the at least one of the first high-k dielectric layer and the first interfacial layer and has a second concentration of the second dopant species at the first particular location in the at least one of the first high-k dielectric layer and the first interfacial layer. The second transistor has a third concentration of the first dopant species in a second particular location of at least one of the second high-k dielectric layer and the second interfacial layer and has a fourth concentration of the second dopant species in the second particular location of the at least one of the second high-k dielectric layer and the second interfacial layer. The second particular location of the second transistor corresponds with the first particular location of the first transistor. A first ratio of the first concentration to the second concentration is substantially equal to a second ratio of the third concentration to the fourth concentration, and wherein the first and second transistors have different conductivity types.

Figure 8:
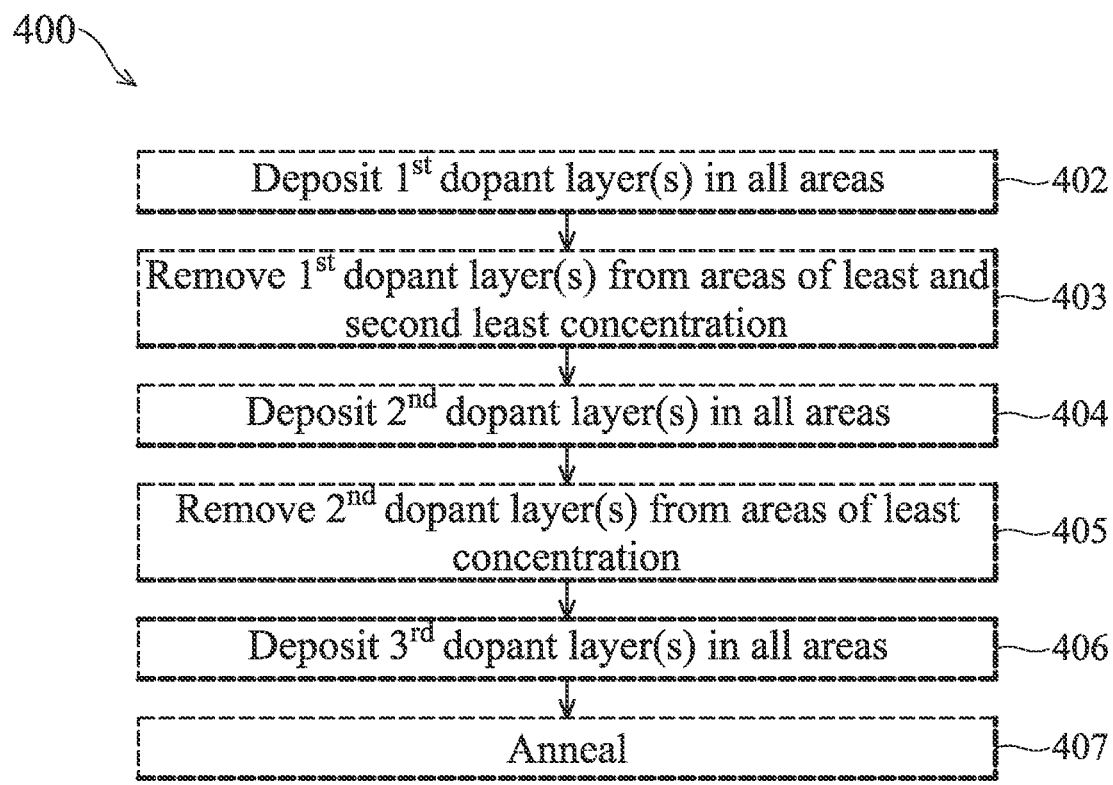
FIG. 8 is a flowchart of a method of forming three types of doping concentration ratios or concentration ratio profiles, in accordance with some embodiments.

FIG. 8 is a flowchart of a method 400 of forming three types of doping concentration ratios or concentration profiles according to some embodiments. A similar method can be used for forming six, or more, types of doping concentration ratios or concentration profiles according to some embodiments. In this embodiment, each of the three types of doping concentration ratios or concentration profiles corresponds with one of three types of transistor voltage thresholds. The first type of transistor voltage threshold corresponds with the standard threshold voltage (SVT) P-type transistors and the very low threshold voltage (uLVT) N-type transistors. The second type of transistor voltage threshold corresponds with the low threshold voltage (LVT) P-type transistors and the low threshold voltage (LVT) N-type transistors. The third type of transistor voltage threshold corresponds with the very low threshold voltage (uLVT) P-type transistors and the standard threshold voltage (SVT) N-type transistors.

The principles and characteristics of method 400 may be applied to methods of forming other numbers of types of doping concentration ratios or concentration ratio profiles. For example, as understood by those of skill in the art, the principles and characteristics of method 400 may be applied to form six different types of doping concentration ratios or concentration ratio profiles to form the N-type transistors 310, 320, and 330 and P-type transistors 340, 350, and 360 of certain embodiments of semiconductor device 300.

In the ensuing discussion of method 400 in FIG. 8, reference is made to the formation of a particular embodiment of semiconductor device 300. In the particular embodiment of semiconductor device 300, N-type transistor 310 is a very low threshold voltage (uLVT) N-type transistor, N-type transistor 320 is a low threshold voltage (LVT) N-type transistor, and N-type transistor 330 is a standard threshold voltage (SVT) N-type transistor, P-type transistor 340 is a standard threshold voltage (SVT) P-type transistor, P-type transistor 350 is a low threshold voltage (LVT) P-type transistor, and P-type transistor 360 is a very low threshold voltage (uLVT) P-type transistor.

The varying threshold voltages among the transistors may be achieved by using first, second, and third dopant species in varying concentration ratios or concentration profiles.

In some embodiments, the first dopant species may include a P-type dopant species which forms p-dipole elements having a p polarity. The first dopant species may, for example, include or be Gallium (Ga), Magnesium (Mg), Hydrogen (H), Beryllium (Be), Titanium (Ti), Vanadium (V), Niobium (Nb), Molybdenum (Mo), Tantalum (Ta), Tungsten (W), Indium (In), Zinc (Zn), Palladium (Pd) the like, or a combination thereof. The first dopant species may be selected based, for example, on it having a suitable electronegativity and it forming an oxide having appropriate characteristics, such as dielectric constant, structural or lattice formation, and areal oxygen density.

In some embodiments, inclusion of the second dopant species may favorably affect one or more structural or lattice properties of one or more of the interfacial layer, the high-k dielectric layer, and an interface between the interfacial layer and the high-k dielectric layer. In some embodiments, inclusion of the second dopant species may favorably affect the capacitance equivalent thickness (CET) of one or more of the interfacial layer and the high-k dielectric layer.

In some embodiments, inclusion of the second dopant species may favorably affect gap state formation at an interface between the interfacial layer and the high-k dielectric layer. In some embodiments, inclusion of the second dopant species may favorably affect periodic symmetry of the interface between the interfacial layer and the high-k dielectric layer. For example, the inventors have observed that dopant species gallium (Ga) at the interface between the interfacial layer and the high-k dielectric layer causes local non-symmetry in the atomic structures and gap states formation in the energy band structure. In some embodiments, the concentration ratio between the first dopant species Ga and the second dopant species Zn is 2:1, within process control and measurement limitations and variations.

In some embodiments, inclusion of the second dopant species may favorably affect the time dependent dielectric breakdown (TDDB) of one or more of the interfacial layer and the high-k dielectric layer. For example, the TDDB of one or more of the interfacial layer and the high-k dielectric layer may improve by a factor of about 2E7 over the TDDB of one or more of the interfacial layer and the high-k dielectric layer having the same concentrations of the first and third dopants and omitting the second dopant.

For example, the inventors have observed that dopant species gallium (Ga) at the interface between the interfacial layer and the high-k dielectric layer causes local non-symmetry in the atomic structures and gap states formation in the energy band structure. Further, the inclusion of dopant species zinc (Zn) at the interface between the interfacial layer and the high-k dielectric layer restores periodical symmetry, reduces or removes gap states, and improves TDDB. In some embodiments, the concentration ratio between the first dopant species Ga and the second dopant species Zn is 2:1, within process control and measurement limitations and variations.

In some embodiments, the second dopant species may include or be Zinc (Zn), Magnesium (Mg), Hydrogen (H), Beryllium (Be), Calcium (Ca) the like, or a combination thereof. The second dopant species may be selected based, for example, on it having a suitable electronegativity and it forming an oxide having appropriate characteristics, such as dielectric constant, structural or lattice formation, and areal oxygen density.

In some embodiments, the third dopant species may include an N-type dopant species which forms n-dipole elements having an n polarity, where the n polarity is opposite the p polarity of the first dopant species, and may, for example, include or be lanthanum (La), aluminum (Al), scandium (Sc), ruthenium (Ru), zirconium (Zr), erbium (Er), magnesium (Mg), strontium (Sr), Yttrium (Y), the like, or a combination thereof; an oxide thereof; a nitride thereof; a carbide thereof; and/or a combination thereof. The third dopant species may be selected based, for example, on it having a suitable electronegativity and it forming an oxide having appropriate characteristics, such as dielectric constant, lattice formation, and areal oxygen density.

Accordingly, N-type transistor 310 is formed with a relatively very low concentration ratio of the first dopant species to the third dopant species, N-type transistor 320 is formed with a relatively low concentration ratio of the first dopant species to the third dopant species, N-type transistor 330 is formed with a relatively standard or nominal concentration ratio of the first dopant species to the third dopant species, P-type transistor 340 is formed with a relatively very low concentration ratio of the first dopant species to the third dopant species, P-type transistor 350 is formed with a relatively low concentration ratio of the first dopant species to the third dopant species, and P-type transistor 360 is formed with a relatively standard or nominal concentration ratio of the first dopant species to the third dopant species.

Method 400 in FIG. 8 begins with optional step 402 in which one or more first dopant layers are deposited at least in regions corresponding with all regions of a substrate. Each of the first dopant layers comprises one, two, or all three of the first, second, and third dopant species.

Dopant layers that provide the first dopant species include oxides of the first dopant species. For example, a dopant layer containing GaOx provides dopant species Ga, where x is a number that represents a stoichiometric gallium oxide. In some embodiments, the gallium oxide is Ga2O3. Other dopant layers for the first dopant species include MgOx, HOx, BeOx, TiOx, VOx, NbOx, MoOx, TaOx, WOx, InOx, Pdx, or the like, where x is a number that represents a stoichiometric composition in the metal oxide. For example, the dopant layers can include MgO, TiO2, V2O3, NbO2, Ta2O5, etc.

Dopant layers that provide the second dopant species include oxides of the second dopant species. For example, a dopant layer containing ZnOx can provide dopant species Zn, where x is a number that represents a stoichiometric zinc oxide. In some embodiments, the zinc oxide is ZnO. Other dopant layers for the second dopant species include MgOx, HOx, BeOx, CaOx, or the like, where x is a number that represents a stoichiometric composition in the metal oxide. For example, the dopant layers can include MgO, BeO, CaO, etc.

Dopant layers that provide the third dopant species include oxides of the third dopant species. For example, a dopant layer containing LaOx can provide dopant species La, where x is a number that represents a stoichiometric lanthanum oxide. In some embodiments, the lanthanum oxide is La2O3. Other dopant layers for the third dopant species include AlOx, ScOx, ROx, ZrOx, ErOx, MgOx, SrOx, YOx, or the like, where x is a number that represents a stoichiometric composition in the metal oxide. For example, the dopant layers can include Al2O3, ZrO2, MgO, SrO2, etc.

Each of the first dopant layers may be deposited by atomic layer deposition (ALD), plasma enhanced chemical vapor deposition (PECVD), molecular beam deposition (MBD), or another deposition technique. Each of the first dopant layers can have a thickness in a range from about 0.1 Å to about 1000 Å, and is not limited.

For example, when used to form the particular embodiment of semiconductor device 300 described above, during step 402 a single first dopant layer may be deposited at least in regions corresponding with N-type transistors 310, 320, and 330 and P-type transistors 340, 350, and 360, where the first dopant layer comprises the first and second dopant species in a predetermined concentration ratio. For example, the predetermined concentration ratio may result in the concentration of the first dopant species being a factor of about 2, about 3, about 4, about 5, about 6, about 7, about 8, about 9, about 10, about 12, or about 15 times the concentration of the second dopant species. Other factors may be used. In some embodiments, the predetermined concentration ratio may result in the concentration of the first dopant species being in a range between about 0 and about 10, between about 0 and about 5, between about 2 and about 7, or between about 5 and about 10 times the concentration of the second dopant species. Other ranges may be used.

The method 400 in FIG. 8 continues with optional step 403 in which the one or more first dopant layers which have been deposited in step 402 are removed from areas corresponding with relatively very low and relatively low concentration ratio of the first dopant species to the third dopant species. For example, the one or more first dopant layers may be removed from the targeted areas using suitable photolithography and etching processes. The etching processes may be a dry etch or a wet etch process, such as a reactive ion etch (RIE), neutral beam etch (NBE), the like, or a combination thereof.

For example, when used to form the particular embodiment of semiconductor device 300 described above, during step 403 the first dopant layer deposited in regions corresponding with N-type transistors 310 and 320, and P-type transistors 340 and 350 may be removed.

Method 400 in FIG. 8 continues with optional step 404 in which one or more second dopant layers are deposited at least in regions corresponding with all regions of a substrate. Each of the second dopant layers comprises one, two, or all three of first, second, and third dopant species. Each of the second dopant layers may be deposited by atomic layer deposition (ALD), plasma enhanced chemical vapor deposition (PECVD), molecular beam deposition (MBD), or another deposition technique. Each of the second dopant layers can have a thickness in a range from about 0.1 Å to about 1000 Å, and is not limited.

For example, when used to form the particular embodiment of semiconductor device 300 described above, during step 404 a single second dopant layer may be deposited at least in regions corresponding with N-type transistors 310, 320, and 330 and P-type transistors 340, 350, and 360, where the second dopant layer comprises the first and second dopant species in a predetermined concentration ratio. For example, the predetermined concentration ratio may result in the concentration of the first dopant species being a factor of about 2, about 3, about 4, about 5, about 6, about 7, about 8, about 9, about 10, about 12, or about 15 times the concentration of the second dopant species. Other factors may be used. In some embodiments, the predetermined concentration ratio may result in the concentration of the first dopant species being in a range between about 0 and about 10, between about 0 and about 5, between about 2 and about 7, or between about 5 and about 10 times the concentration of the second dopant species. Other ranges may be used.

The method 400 in FIG. 8 continues with optional step 405 in which the one or more second dopant layers which have been deposited in step 404 are removed from areas corresponding with relatively very low concentration ratio of the first dopant species to the third dopant species. For example, the one or more first dopant layers may be removed from the targeted areas using suitable photolithography and etching processes. The etching processes may be a dry etch or a wet etch process, such as a reactive ion etch (RIE), neutral beam etch (NBE), the like, or a combination thereof.

For example, when used to form the particular embodiment of semiconductor device 300 described above, during step 405 the second dopant layer deposited in regions corresponding with N-type transistor 310 and P-type transistor 340 may be removed.

Method 400 in FIG. 8 continues with optional step 406 in which one or more third dopant layers are deposited at least in regions corresponding with all regions of a substrate. Each of the third dopant layers comprises one, two, or all three of first, second, and third dopant species. Each of the third dopant layers may be deposited by atomic layer deposition (ALD), plasma enhanced chemical vapor deposition (PECVD), molecular beam deposition (MBD), or another deposition technique. Each of the third dopant layers can have a thickness in a range from about 0.1 Å to about 1000 Å, and is not limited.

For example, when used to form the particular embodiment of semiconductor device 300 described above, during step 404 a single third dopant layer may be deposited at least in regions corresponding with N-type transistors 310, 320, and 330 and P-type transistors 340, 350, and 360, where the third dopant layer comprises the third dopant species in a predetermined concentration so as to cause predetermined concentration ratios between the third dopant species and the previously deposited first dopant species in each of the regions corresponding with the N-type transistors 320 and 330, and the P-type transistors 350 and 360, and so as to cause a predetermined concentration of the third dopant in the regions corresponding with the N-type transistor 310 and the P-type transistor 340. For example, the predetermined concentration of the third dopant may result in the concentration of the first dopant species being about one half the concentration of the third dopant species in the regions corresponding with the N-type transistor 320 and the P-type transistor 350, and may result in the concentration of the first dopant species being about equal to the concentration of the third dopant species in the regions corresponding with the N-type transistor 340 and the P-type transistor 360. For example, the predetermined concentration ratio may result in the concentration of the first dopant species being a factor of about +/−1, about +/−2, about +/−3, about +/−4, about +/−5, about +/−6, about +/−7, about +/−8, about +/−9, about +/−10, about +/−12, or about +/−15 times the concentration of the third dopant species. Other factors may be used. In some embodiments, the predetermined concentration ratio may result in the concentration of the first dopant species being in a range between about 0 and about +/−10, between about 0 and about +/−5, between about −2 and about −7, between about 2 and about 7, between about −5 and about −10, or between about 5 and about 10 times the concentration of the third dopant species. Other ranges may be used.

In some embodiments, the first dopant species may instead include an N-type dopant species which forms n-dipole elements having an n polarity, where the n polarity is opposite the p polarity of the first dopant species, and may, for example, include or be lanthanum (La), aluminum (Al), scandium (Sc), ruthenium (Ru), zirconium (Zr), erbium (Er), magnesium (Mg), strontium (Sr), the like, or a combination thereof; an oxide thereof; a nitride thereof; a carbide thereof; and/or a combination thereof.

In some embodiments, the third dopant species may instead include a P-type dopant species which forms p-dipole elements having a p polarity. The first dopant species may, for example, include or be Gallium (Ga), Magnesium (Mg), Hydrogen (H), Beryllium (Be), Calcium (Ca) the like, or a combination thereof.

Method 400 in FIG. 8 continues with optional step 407 in which the first, second, and third dopant layers are annealed to drive (e.g., diffuse) the first, second, and third dopant species from the first, second, and third dopant layers into the high-k gate dielectric layer 234. In some examples, the anneal can be a rapid thermal anneal or another thermal process, which may be performed at a temperature in a range from about 400° C. to about 1,100° C. The anneal can have a temperature and/or duration sufficient to drive (e.g., diffuse) the dopant species into the high-k gate dielectric layer 234 to a desired dipole dopant concentration or concentration ratio, for example, at a specific location, such as at an interface between the interfacial layer 232 and the high-k gate dielectric layer 234.

In some embodiments, when method 400 in FIG. 8 is used in step 103 of method 100 in FIG. 1, any or all of steps 402-406 may be performed and step 407 may be omitted. In some embodiments, when method 400 in FIG. 8 is used in step 105 of method 100 in FIG. 1, any or all of steps 402-407 may be performed. In some embodiments, when method 400 in FIG. 8 is used in step 105 of method 100 in FIG. 1, either or both of steps 406 and 407 are omitted. In some embodiments, when method 400 in FIG. 8 is used in step 107 of method 100 in FIG. 1, any or all of steps 402-407 may be performed. In some embodiments, when method 400 in FIG. 8 is used in step 105 of method 100 in FIG. 1, any or all of steps 402-406 are omitted.

According to some embodiments, a method of forming a semiconductor device includes forming a first interfacial layer on a semiconductor substrate, forming a first high-k dielectric layer on the first interfacial layer, and forming a first conductive gate electrode layer on the first high-k dielectric layer. The method also includes doping at least one of the first high-k dielectric layer and the first interfacial layer with a first dopant species, a second dopant species, and a third dopant species. At least one of the first dopant species and the second dopant species forms a first dipole element having a first polarity. The third dopant species forms a second dipole element having a second polarity. The first and second polarities are opposite.

In some embodiments of the method, doping the at least one of the first high-k dielectric layer and the first interfacial layer with the first and second dopant species includes depositing first and second dopant layers.

In some embodiments, the first dopant layer comprises gallium oxide, and the second dopant layer comprises zinc oxide.

In some embodiments, doping the at least one of the first high-k dielectric layer and the first interfacial layer with the first and second dopant species comprises depositing first and second dopant layers on the first interfacial layer.

In some embodiments, doping the at least one of the first high-k dielectric layer and the first interfacial layer with the first and second dopant species comprises depositing first and second dopant layers on the first high-k dielectric layer when the first high-k dielectric layer is only partially formed.

In some embodiments, doping the at least one of the first high-k dielectric layer and the first interfacial layer with the first and second dopant species includes depositing first and second dopant layers on the first high-k dielectric layer when the first high-k dielectric layer is fully formed.

In some embodiments, doping the at least one of the first high-k dielectric layer and the first interfacial layer with the first and second dopant species includes depositing first and second dopant layers before depositing the third dopant layers on the at least one of the first high-k dielectric layer and the first interfacial layer.

In some embodiments, doping the at least one of the first high-k dielectric layer and the first interfacial layer with the first and second dopant species includes depositing first and second dopant layers after depositing the third dopant layers on the at least one of the first high-k dielectric layer and the first interfacial layer.

Figure 9:
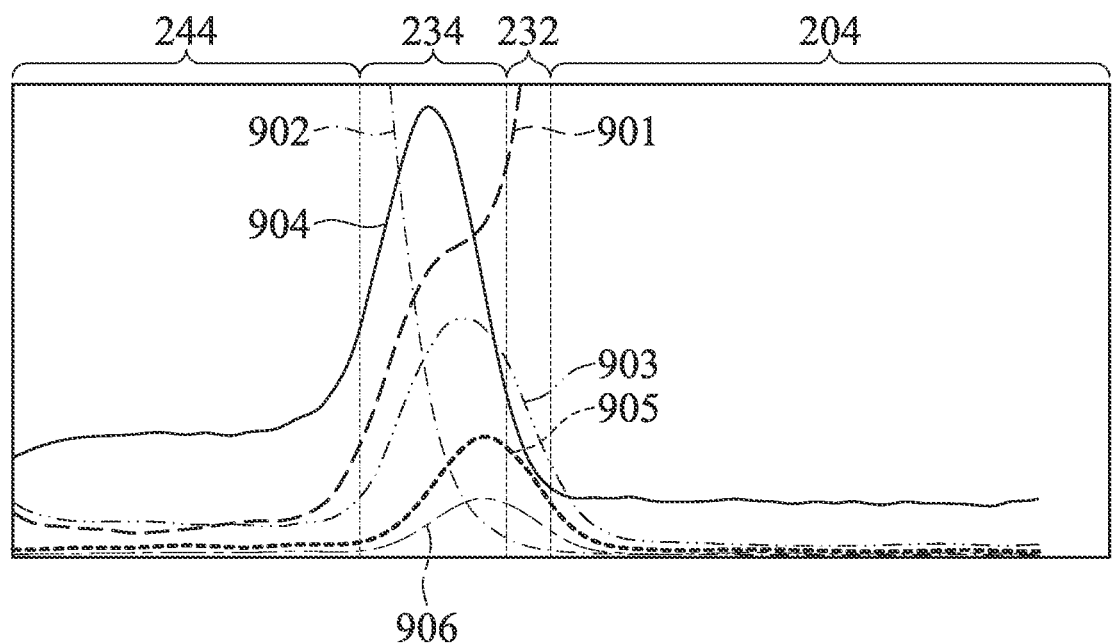
FIG. 9 is a graph depicting dopant concentrations of dopant species in structures formed by methods described herein, in accordance with some embodiments.

FIG. 9 is a graph depicting concentrations of the species in a structure formed by methods described herein in accordance with some embodiments. In this example, the dopant concentrations were determined using X-ray Photoelectron Spectroscopy (XPS).

The graph illustrates species concentration as a function of position in the structure. The positions depicted are across the work function metal 244, the high-k gate dielectric layer 234, interfacial layer 232, and fin region 204. In this example, the high-k gate dielectric layer 234 is made of HfO2, the interfacial layer is made of SiO2, and the fin region is formed in silicon (Si). In FIG. 9, curve 901 is the concentration of silicon (Si) in the fin region; curve 902 is the concentration of the metal species in the work function metal 244, such as titanium (Ti) or aluminum (Al); curve 903 is the concentration of oxygen (O) in the interfacial layer 232 and high-k dielectric layer 234; curve 904 is the concentration of hafnium (Hf) from the high-k gate dielectric layer 234. Further, curves 905 and 906 show the concentrations of dopant species.

In the example, Gallium (Ga) was used as the first dopant species, Zinc (Zn) was used as the second dopant species, and Lanthanum (La) was used as the third dopant species. In FIG. 9, curve 905 shows the concentration of dopant species Ga, and curve 906 shows the concentration of dopant species Zn.

In another embodiment, FIG. 9 can be used to illustrate the structure that is part of a transistor having a concentration of the first dopant species (Ga) being about equal to the concentration of the third dopant species (La), for example, at or near the interface between the high-k gate dielectric layer 234 and the interfacial layer 232, as shown by curve 905 in FIG. 9. Accordingly, the illustrated structure may correspond with the N-type transistor 340 and the P-type transistor 360.

As discussed in detail herein, embodiments illustrate transistors and fabrication of transistors each having one of a number of threshold voltages. The threshold voltages are tuned or determined based on a ratio of n-dipole elements to p-dipole elements, or their profiles, formed in the interfacial and/or high-k dielectric layers of the transistors. The n-dipole and the p-dipole elements are formed as a result of first and third dopant species (e.g. Ga and La) deposited on and driven into the interfacial and/or high-k dielectric layers of the transistors. A second dopant species (e.g. Zn) is also deposited on and driven into the interfacial and/or high-k dielectric layers of the transistors. The second dopant species results in improved CET and TDDB of the interfacial and/or high-k dielectric layers of the transistors.

In accordance with some embodiments, a semiconductor device includes a semiconductor substrate, an interfacial layer formed on the semiconductor substrate, a high-k dielectric layer formed on the interfacial layer, and a conductive gate electrode layer formed on the high-k dielectric layer. At least one of the high-k dielectric layer and the interfacial layer is doped with: a first dopant species, a second dopant species, and a third dopant species. The first dopant species and the second dopant species form a plurality of first dipole elements having a first polarity. The third dopant species forms a plurality of second dipole elements having a second polarity, and the first and second polarities are opposite.

In accordance with some embodiments, a semiconductor device includes a semiconductor substrate, a first transistor having a first threshold voltage, and a second transistor having a second threshold voltage. The first transistor includes a first interfacial layer formed on the semiconductor substrate, a first high-k dielectric layer formed on the first interfacial layer, and a first conductive gate electrode layer formed on the first high-k dielectric layer. The second transistor includes a second interfacial layer formed on the semiconductor substrate, a second high-k dielectric layer formed on the second interfacial layer, and a second conductive gate electrode layer formed on the second high-k dielectric layer. At least one of the first high-k dielectric layer and the first interfacial layer, and at least one of the second high-k dielectric layer and the second interfacial layer are doped with: a first dopant species, a second dopant species, and a third dopant species. At least one of the first dopant species and the second dopant species forms a first dipole element having a first polarity. The third dopant species forms a second dipole element having a second polarity, and the first and second polarities are opposite. Moreover, the first and second threshold voltages are different.

In accordance with some embodiments, a method of forming a semiconductor device includes forming a first interfacial layer on a semiconductor substrate, forming a first high-k dielectric layer on the first interfacial layer, and forming a first conductive gate electrode layer on the first high-k dielectric layer. The method also includes doping at least one of the first high-k dielectric layer and the first interfacial layer with: a first dopant species, a second dopant species, and a third dopant species. At least one of the first dopant species and the second dopant species forms a first dipole element having a first polarity. The third dopant species forms a second dipole element having a second polarity, and wherein the first and second polarities are opposite.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and
   a p-type transistor and an n-type transistor formed on the substrate, each of the p-type transistor and the n-type transistor comprising:
   an interfacial layer formed on the substrate; and
   a high-k dielectric layer formed on the interfacial layer;
   wherein at least one of the high-k dielectric layer and the interfacial layer is doped with: a first dopant species having a first concentration, a second dopant species having a second concentration, and a third dopant species having a third concentration, the first dopant species and the second dopant species forming a plurality of first dipole elements having a first polarity, and the third dopant species forming a plurality of second dipole elements having a second polarity opposite to the first polarity;
   wherein the p-type transistor is characterized by a first concentration ratio of the first concentration of the first dopant species to the second concentration of the second dopant species in the at least one of the high-k dielectric layer and the interfacial layer of the p-type transistor;
   wherein the n-type transistor is characterized by a second concentration ratio of first concentration of the first dopant species to the second concentration of the second dopant species in the at least one of the high-k dielectric layer and the interfacial layer of the n-type transistor; and
   wherein the first concentration ratio is different from the second concentration ratio.

2. The semiconductor device of claim 1, wherein the first dopant species comprises gallium (Ga), and the second dopant species comprises Zinc (Zn).

3. The semiconductor device of claim 2, further comprising a first dopant layer containing Ga and a second dopant layer containing Zn disposed between the interfacial layer and the high-k dielectric layer.

4. The semiconductor device of claim 1, wherein the third dopant species comprises at least one of lanthanum (La), aluminum (Al), scandium (Sc), ruthenium (Ru), zirconium (Zr), erbium (Er), magnesium (Mg), or strontium (Sr).

5. The semiconductor device of claim 1, wherein the first dopant species comprises at least one of gallium (Ga), Magnesium (Mg), Hydrogen (H), and Beryllium (Be), and wherein the second dopant species comprises at least one of Zinc (Zn), Magnesium (Mg), Hydrogen (H), Beryllium (Be), and Calcium (Ca).

6. The semiconductor device of claim 1, wherein each of the p-type transistor and the n-type transistor further comprises a conductive gate electrode layer formed on the high-k dielectric layer.

7. The semiconductor device of claim 1, wherein the p-type transistor is characterized by a third concentration ratio of the first concentration of the first dopant species to the third concentration of the third dopant species in the at least one of the high-k dielectric layer and the interfacial layer of the p-type transistor, and wherein the n-type transistor is characterized by a fourth concentration ratio of first concentration of the first dopant species to the third concentration of the third dopant species in the at least one of the high-k dielectric layer and the interfacial layer of the n-type transistor, and wherein the third concentration ratio is different from the fourth concentration ratio.

8. The semiconductor device of claim 1, wherein the p-type transistor has a first threshold voltage, the n-type transistor has a second threshold voltage different from the first threshold voltage.

9. A semiconductor device, comprising:
   a substrate;
   a first transistor having a first threshold voltage and a first conductivity type, the first transistor comprising:
   a first interfacial layer formed on the substrate; and
   a first high-k dielectric layer formed on the first interfacial layer;
   a second transistor having a second threshold voltage and a second conductivity type, the second transistor comprising:
   a second interfacial layer formed on the substrate; and
   a second high-k dielectric layer formed on the second interfacial layer;
   wherein at least one of the first high-k dielectric layer and the first interfacial layer, and at least one of the second high-k dielectric layer and the second interfacial layer are doped with:
   a first dopant species;
   a second dopant species; and
   a third dopant species;
   wherein at least one of the first dopant species and the second dopant species forms a first dipole element having a first polarity, and the third dopant species forms a second dipole element having a second polarity opposite to the first polarity;
   wherein the first transistor is characterized by a first concentration of the first dopant species at a first particular location in the at least one of the first high-k dielectric layer and the first interfacial layer and a second concentration of the second dopant species at the first particular location in the at least one of the first high-k dielectric layer and the first interfacial layer;
   wherein the second transistor is characterized by a third concentration of the first dopant species at a second particular location in the at least one of the second high-k dielectric layer and the second interfacial layer and a fourth concentration of the second dopant species at the second particular location in the at least one of the second high-k dielectric layer and the second interfacial layer, wherein the second particular location of the second transistor corresponds with the first particular location of the first transistor; and
   wherein a first concentration ratio of the first concentration to the second concentration is substantially equal to a second concentration ratio of the third concentration to the fourth concentration.

10. The semiconductor device of claim 9, wherein the second conductivity type is different from the first conductivity type.

11. The semiconductor device of claim 9, wherein the first threshold voltage is different from the second threshold voltage.

12. The semiconductor device of claim 9, wherein the first dopant species comprises gallium (Ga), and the second dopant species comprises Zinc (Zn).

13. The semiconductor device of claim 12, further comprising a first dopant layer containing Ga and a second dopant layer containing Zn disposed between the interfacial layer and the high-k dielectric layer.

14. The semiconductor device of claim 9, wherein the third dopant species comprises at least one of lanthanum (La), aluminum (Al), scandium (Sc), ruthenium (Ru), zirconium (Zr), erbium (Er), magnesium (Mg), or strontium (Sr).

15. The semiconductor device of claim 9, wherein the first dopant species comprises at least one of gallium (Ga), Magnesium (Mg), Hydrogen (H), and Beryllium (Be), and wherein the second dopant species comprises at least one of Zinc (Zn), Magnesium (Mg), Hydrogen (H), Beryllium (Be), and Calcium (Ca).

16. A method, comprising:
providing a substrate;
forming a first interfacial layer on the substrate;
forming a first high-k dielectric layer on the first interfacial layer;
forming a first conductive gate electrode layer on the first high-k dielectric layer; and
doping at least one of the first high-k dielectric layer and the first interfacial layer with: a first dopant species, a second dopant species, and a third dopant species, wherein at least one of the first dopant species and the second dopant species forms a first dipole element having a first polarity, and the third dopant species forms a second dipole element having a second polarity opposite to the first polarity; and
wherein doping the at least one of the first high-k dielectric layer and the first interfacial layer comprises:
depositing a first dopant layer comprising the first dopant species and a second dopant layer comprising the second dopant species; and
depositing a third dopant layer comprising the third dopant species.

17. The method of claim 16, wherein the first dopant layer comprises gallium oxide, and the second dopant layer comprises zinc oxide.

18. The method of claim 16, wherein the first dopant layer and the second dopant layer are deposited on the first interfacial layer.

19. The method of claim 16, wherein the first dopant layer and the second dopant layer are deposited on the first high-k dielectric layer.

20. The method of claim 19, wherein the first dopant layer and the second dopant layer are deposited on the first high-k dielectric layer when the first high-k dielectric layer is partially formed.

* * * * *